US008515216B2

(12) United States Patent
Abad et al.

(10) Patent No.: US 8,515,216 B2
(45) Date of Patent: Aug. 20, 2013

(54) INTEGRATED SILICON-BASED NONLINEAR PHOTODETECTOR

(75) Inventors: Jorge Bravo Abad, Cambridge, MA (US); Erich P. Ippen, Belmont, MA (US); Marin Soljacic, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 504 days.

(21) Appl. No.: 12/611,287

(22) Filed: Nov. 3, 2009

(65) Prior Publication Data

US 2010/0166364 A1 Jul. 1, 2010

Related U.S. Application Data

(60) Provisional application No. 61/111,015, filed on Nov. 4, 2008.

(51) Int. Cl.
*G02F 1/295* (2006.01)
*G02B 6/12* (2006.01)
*G02B 6/26* (2006.01)
*G02B 6/42* (2006.01)

(52) U.S. Cl.
USPC .................................... 385/14; 385/5; 385/31

(58) Field of Classification Search
USPC .................................... 385/14, 5, 31
See application file for complete search history.

(56) References Cited

U.S. PATENT DOCUMENTS 5,838,870 A * 11/1998 Soref ............................. 385/131
5,999,308 A    12/1999 Nelson et al.
2002/0071621 A1 * 6/2002 Yamada ............................ 385/2
2005/0104064 A1   5/2005 Hegarty et al.
2009/0028487 A1 * 1/2009 Fattal et al. ....................... 385/2
2011/0097045 A1 * 4/2011 Benabid ........................... 385/95

OTHER PUBLICATIONS

Barclay et al., "Nonlinear response of silicon photonic crystal microresonators excited via an integrated waveguide and fiber taper," Feb. 7, 2005, Optics Express, vol. 13, No. 3, pp. 801-820.*
Ahn, et al., "High performance, waveguide integrated Ge photodetectors", *Optics Express*, vol. 15, No. 7, pp. 3916-3921 (Apr. 2, 2007).
Boyd, "The Nonlinear Optical Susceptibility", *Nonlinear Optics*, pp. 1-65, Academic Press (2003).
Carmon et al., "Dynamical thermal behavior and thermal self-stability of microcavities", *Optics Express*, vol. 12, No. 20, pp. 4742-4750 (Oct. 4, 2004).
Chan et al., "Emulating one-dimensional resonant Q-matching behavior in a two-dimensional system via Fano resonances", *Physical Review A*, vol. 74, pp. 064901-1-064901-4 (2006).

(Continued)

*Primary Examiner* — Ryan Lepisto
*Assistant Examiner* — Jerry Blevins
(74) *Attorney, Agent, or Firm* — Fish & Richardson P.C.

(57) ABSTRACT

Disclosed is a system including an integrated silicon-based structure including a microcavity configured to receive optical energy from an input beam carrying an optical signal and absorb the optical energy by a nonlinear multi-photon absorption process. For example, the multi-photon absorption process can be two-photon absorption (TPA). The integrated silicon-based structure further includes electrodes responsive to the nonlinear multi-photon absorption process in the microcavity for producing an electronic signal indicative of the optical signal. A related method is also disclosed.

33 Claims, 9 Drawing Sheets

(56) References Cited

OTHER PUBLICATIONS

Chen et al., "High performance germanium photodetectors integrated on submicron silicon waveguides by low temperature wafer bonding", *Optics Express*, vol. 16, No. 15, pp. 11513-11518 (Jul. 21, 2008).

Claps et al., "Influence of nonlinear absorption on Raman amplification in Silicon waveguides", *Optics Express*, vol. 12, No. 12, pp. 2774-2780 (Jun. 14, 2004).

Colace et al., "Waveguide Photodetectors for the Near-Infrared in Polycrystalline Germanium on Silicon", *IEEE Photonics Technology Letters*, vol. 18, No. 9, pp. 1094-1096 (May 1, 2006).

Dehlinger et al., "High-Speec Germanium-on-SOI Lateral PIN Photodiodes", *IEEE Photonics Technology Letters*, vol. 16, No. 11, pp. 2547-2549 (Nov. 2004).

Farjadpour et al, "Improving accuracy by subpixel smoothing in the finite-difference time domain", *Optics Letters*, vol. 31, No. 20, pp. 2972-2974 (Oct. 15, 2006).

Gunn, "10Gb/s CMOS Photonics Technology", *Proceedings of SPIE*, vol. 6125, pp. 612501-1-612501-5 (2006).

Haus, "Coupling of Modes—Resonators and Couplers", *Waves and Fields in Optoelectronics*, pp. 197-223, Prentice Hall, Inc. (1984).

Joannopoulos et al., *Photonic Crystals, Molding the Flow of Light*, pp. 66-93, 264-281, Princeton University Press (2008).

Johnson et al, "Self-induced optical modulation of the transmission through a high-$Q$ silicon microdisk resonator", *Optical Express*, vol. 14, No. 2, pp. 817-831 (Jan. 23, 2006).

Jutzi et al., "Ge-on-Si Vertical Incidence Photodiodes With 39-GHz Bandwidth", *IEEE Photonics Technology Letters*, vol. 17, No. 7, pp. 1510-1512 (Jul. 2005).

Kimerling et al., "Electronic-photonic integrated circuits on the CMOS platform",*Proceedings of SPIE*, vol. 6125, pp. 612502-1-612502-10 (2006).

Lipson, "Guiding, Modulating, and Emitting Light on Silicon—Challenges and Opportunities", *Journal of Lightwave Technology*, vol. 23, No. 12, pp. 4222-4237 (Dec. 2005).

Little et al., "Microring Resonator Channel Dropping Filters", *Journal of Lightwave Technology*, vol. 15, No. 6, pp. 998-1005 (Jun. 1997).

Liu et al, "High-performance, tensile-strained Ge $p$-$i$-$n$ photodetectors on a Si platform", *Applied Physics Letters*, vol. 87, pp. 103501-1-103501-3 (2005).

Liu, et al., "Design of monolithically integrated GeSi electro-absorption modulators and photodetectors on an SOI platform", *Optics Express*, vol. 15, No. 2, pp. 623-628 (Jan. 22, 2007).

Pavesi et al., "Silicon Fundamentals for Photonics Applications", *Silicon Photonics*, pp. 1-50, Springer-Verlag Berlin Heidelberg, Printed in Germany (2004).

Povinelli et al., "Emulation of two-dimensional photonic crystal defect modes in a photonic crystal with a three-dimensional photonic band gap", *Physical Review B*, vol. 64, pp. 075313-1-075313-8 (2001).

Reed, *Silicon Photonics, The State of the Art*, pp. 1-14, 191-227, John Wiley & Sons Inc. (2008).

Rong et. al, "A continuous-wave Raman silicon laser", *Nature*, vol. 433, pp. 725-728 (Feb. 17, 2005).

Soljacic et al., "Enhancement of nonlinear effects using photonic crystals", *Nature Materials*, vol. 3, pp. 211-219 (Apr. 2004).

Soref, "The Past, Present, and Future of Silicon Photonics", *IEEE Journal of Selected Topics in Quantum Electronics*, vol. 12, No. 6, pp. 1678-1687 (Nov./Dec. 2006).

Taflove et al., "Introduction to Maxwell's Equations and the Yee Algorithm", *Computational Electrodynamics, The Finite-Difference Time-Domain Method*, pp. 51-105, Artech House (2005).

Vahala, "Optical Microcavities", *Nature*, vol. 424, pp. 839-846 (Aug. 14, 2003).

Vivien et al, "High speed and high responsivity germanium photodetector integrated in a Silicon-On-Insulator microwaveguide", *Optics Express*, vol. 15, No. 15, pp. 9843-9848 (Jul. 23, 2007).

Xu, et al., "Scattering-theory analysis of waveguide-resonator coupling,", *Physical Review E*, vol. 62, No. 5, pp. 7389-7404 (Nov. 2000).

Yin et al., "31 Ghz Ge $n$-$i$-$p$ waveguide photodetectors on Silicon-on-Insulator substrate", *Optics Express*, vol. 15, No. 21, pp. 13965-13971 (Oct. 17, 2007).

International Preliminary Report on Patentability for International Application No. PCT/US2009/063038 by Examiner Athina Nickitas-Etienne dated May 19, 2011.

Paul E. Barclay et al., "Nonlinear response of silicon photonic crystal microresonators excited via an integrated waveguide and fiber taper", *Optics Express*, vol. 13, No. 3, pp. 801-820 (Feb. 7, 2005).

H. Folliot et al., "Two-photon absorption photocurrent enhancement in bulk AIGaAs semiconductor microcavities", *Applied Physics Letters*, vol. 80, No. 8, pp. 1328-1330 (Feb. 25, 2002).

T. Knodl et al., "RCE Photodetectors Based on VCSEL Structures", *IEEE Photonics Technology Letters*, vol. 11, No. 10, pp. 1289-1291 (Oct. 1999).

T.K. Liang et al., "Silicon waveguide two-photon absorption detector at 1.5 μm wavelength for autocorrelation measurements", *Applied Physics Letters*, vol. 81, No. 7, pp. 1323-1325 (Aug. 12, 2002).

Stefan F. Preble et al., "Ultrafast all-optical modulation on a silicon chip", *Optics Letters*, vol. 30, No. 21, pp. 2891-2893 (Nov. 1, 2005).

Takasumi Tanabe et al., "Fast bistable all-optical switch and memory on a silicon photonic crystal on-chip", *Optics Letters*, vol. 30, No. 19, pp. 2575-2577 (Oct. 1, 2005).

B.C. Thomsen et al., "Ultrahigh speed all-optical demultiplexing based on two-photon absorption in a laser diode", *Electronics Letters*, vol. 34, No. 19, pp. 1871-1872 (Sep. 17, 1998).

Stephan Wielandy et al., "Optical Performance Monitoring Using Nonlinear Detection", *Journal of Lightwave Technology*, vol. 22, No. 3, pp. 784-793 (Mar. 2004).

International Search Report for International Application No. PCT/US09/63038 dated Jul. 15, 2010.

\* cited by examiner

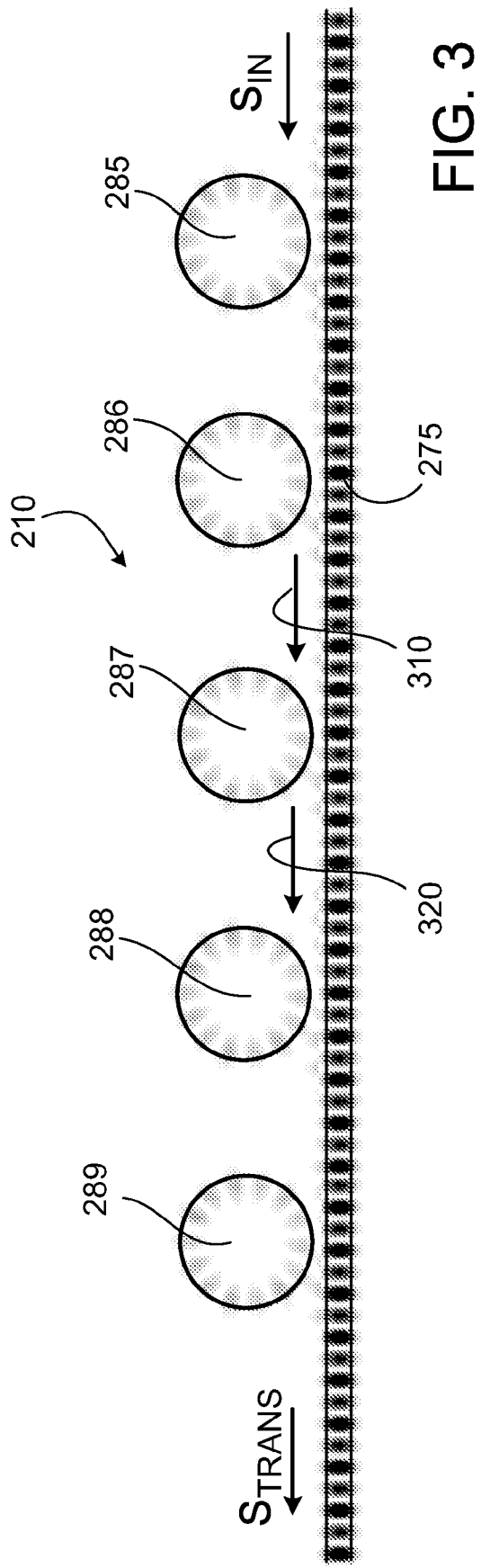

INTEGRATED SILICON-BASED NONLINEAR PHOTODETECTOR

PRIORITY CLAIM

This patent application claims the benefit of the priority date of U.S. Provisional Patent Application No. 61/111,015, filed on Nov. 4, 2008, pursuant to 35 USC 119. The entire content of this provisional application is herein incorporated by reference.

STATEMENT AS TO FEDERALLY FUNDED RESEARCH

This invention was made with government support under Grant No. DMR0819762 awarded by the National Science Foundation and under Contract No. FA9550-07-1-0014 awarded by the U.S. Air Force and under Contract No. W911NF-07-D-0004 awarded by the Army Research Office. The government has certain rights in this invention.

FIELD OF THE INVENTION

The invention relates to an integrated silicon-based nonlinear photodetector suitable for use in silicon photonics and in telecommunications networks.

BACKGROUND

In many applications, including optical telecommunications, it is often desirable to convert an optical signal into an electrical signal. This can be done by photodetection, whereby the optical signal is linearly absorbed in a semiconductor material to create free carriers that cause an electrical response at nearby biased electrodes. Ideally, well established fabrication techniques for silicon, such as complementary metal-oxide-semiconductor (CMOS), could be used to fabricate an integrated photodetector in silicon. Unfortunately, the energy of the indirect electronic bandgap of silicon (1.1 eV) is too large for linear absorption of the energy of photons in the telecommunication band (0.8 eV).

SUMMARY

In general, disclosed herein as a system including an integrated silicon-based structure including a microcavity configured to receive optical energy from an input beam carrying an optical signal and absorb the optical energy by a nonlinear multi-photon absorption process. For example, the multi-photon absorption process can be two-photon absorption (TPA). The integrated silicon-based structure further includes electrodes responsive to the nonlinear multi-photon absorption process in the microcavity for producing an electronic signal indicative of the optical signal.

Embodiments of the system can include one or more of the following features.

The integrated silicon-based structure can further include an optical waveguide for receiving the input beam carrying an optical signal, with the microcavity being optically coupled to the waveguide to receive the optical energy from the input beam.

The microcavity can include silicon, with the nonlinear multi-photon absorption process taking place in the silicon.

The microcavity can have a resonant frequency $\omega_0$, a quality factor Q, and a modal volume $V_{MODE}$, and wherein the input beam carrying the optical signal has a wavelength in air equal to $\lambda_{AIR}$, with 1.2 µm<$\lambda_{AIR}$<2.4 µm. Alternatively, or in addition, the microcavity can have a resonant frequency $\omega_0$, a quality factor Q, and a modal volume $V_{MODE}$, and wherein the system further includes a source for the input beam, and wherein the input beam carrying the optical signal has a wavelength in air equal to $\lambda_{AIR}$.

For example, Q>100 and $V_{MODE}$<1000 $\lambda_{AIR}^3$, or more specifically, for example, Q>1000 and $V_{MODE}$<100 $\lambda_{AIR}^3$, or even more specifically, for example, $V_{MODE}$<10 $\lambda_{AIR}^3$.

Also, for example, the input beam carrying the optical signal can have a carrier frequency equal to $\omega$, and wherein $|\omega-\omega_0|/\omega_0$<10/Q, or more specifically, for example, wherein $|\omega-\omega_0|/\omega_0$<5/Q, or even more specifically, for example, wherein $|\omega-\omega_0|/\omega_0$<1/Q.

Also, for example, the microcavity can be configured to achieve a conversion efficiency for the multi-photon absorption of the optical energy in the input beam of greater than 15% for an input beam power smaller than 0.2 mW.

The microcavity can be a photonic crystal structure.

The waveguide can be a photonic crystal structure.

The integrated silicon-based structure can be implemented in a Complementary metal-oxide-semiconductor (CMOS) platform.

The input beam carrying the optical signal can have a carrier frequency equal to $\omega$, wherein N photons, with N>1, are absorbed simultaneously by a material in the microcavity during the multi-photon absorption process, and wherein the multi-photon absorption material has an indirect electronic bandgap $E_g$ larger than the energy corresponding to a single photon of frequency $\omega$ and smaller than the energy of the N photons absorbed simultaneously by the material.

The integrated silicon-based structure can further include an output optical waveguide optically coupled to the microcavity and configured to output optical energy from the microcavity that is not absorbed by the multi-photon absorption process.

Furthermore, in certain embodiments of the system, the integrated silicon-based structure comprises multiple microcavities each optically coupled to the waveguide and configured to receive optical energy from the input beam and absorb the optical energy by a nonlinear multi-photon absorption process.

In general, in another aspect, disclosed herein is method including: i) directing an input beam carrying an optical signal into an integrated silicon-based structure including a microcavity; ii) receiving optical energy in the microcavity from the input beam and absorbing the optical energy in the microcavity by a nonlinear multi-photon absorption process; and iii) producing an electronic signal in response to the nonlinear multi-photon absorption process in the microcavity, the electrical signal indicative of the optical signal. For example, the multi-photon absorption process can be two-photon absorption (TPA).

Embodiments of the method can include one or more of the following features.

The integrated silicon-based structure can further include an optical waveguide for receiving the input beam carrying an optical signal, with the microcavity being optically coupled to the waveguide to receive the optical energy from the input beam.

The integrated silicon-based structure can further include electrodes responsive to the nonlinear multi-photon absorption process in the microcavity for producing the electronic signal indicative of the optical signal.

The microcavity can include silicon, with the nonlinear multi-photon absorption process taking place in the silicon.

The microcavity can have a resonant frequency $\omega_0$, a quality factor Q, and a modal volume $V_{MODE}$, wherein the input beam carrying the optical signal has a wavelength in air equal to $\lambda_{AIR}$, and wherein Q>100 and $V_{MODE}$<1000 $\lambda_{AIR}^3$. More specifically, for example, Q>1000 and $V_{MODE}$<100 $\lambda_{AIR}^3$, more specifically, for example, wherein $V_{MODE}$<10 $\lambda_{AIR}^3$.

The input beam carrying the optical signal can have a carrier frequency equal to $\omega$, and wherein $|\omega-\omega_0|/\omega_0$<10/Q. More specifically, for example, wherein $|\omega-\omega_0|/\omega_0$<5/Q. Even more specifically, for example, wherein $|\omega-\omega_0|/\omega_0$<1/Q.

The input beam carrying the optical signal can have a wavelength in air equal to $\lambda_{AIR}$, and 1.2 μm<$\lambda_{AIR}$<2.4 μm.

The microcavity can be configured to achieve a conversion efficiency for the multi-photon absorption of the optical energy in the input beam of greater than 15% for an input beam power smaller than 0.2 mW.

The microcavity can be a photonic crystal structure.

The waveguide can be a photonic crystal structure.

The integrated silicon-based structure can be implemented in a Complementary metal-oxide-semiconductor (CMOS) platform.

The input beam carrying the optical signal can have a carrier frequency equal to a), wherein N photons, with N>1, are absorbed simultaneously by a material in the microcavity during the multi-photon absorption process, and wherein the multi-photon absorption material has an indirect electronic bandgap $E_g$ larger than the energy corresponding to a single photon of frequency $\omega$ and smaller than the energy of the N photons absorbed simultaneously by the material.

The integrated silicon-based structure can further include an output optical waveguide optically coupled to the microcavity, and wherein the method can further include outputting optical energy from the microcavity that is not absorbed by the multi-photon absorption process through the output optical waveguide.

Furthermore, in certain embodiments of the method, the integrated silicon-based structure comprises multiple microcavities each optically coupled to the waveguide and configured to receive optical energy from the input beam and absorb the optical energy by a nonlinear multi-photon absorption process.

In another aspect, the method can be used to perform optical performance monitoring (OPM) of one or more channels of an optical telecommunications network.

Unless otherwise defined, all technical and scientific terms used herein have the same meaning as commonly understood by one of ordinary skill in the art. All publications, patent applications, patents, and other references mentioned herein are incorporated by reference in their entirety. In case of conflict, the present specification, including definitions, will control. In addition, the materials, methods, and examples are illustrative only and not intended to be limiting.

The term "comprising" in the claims and any variations thereof are used synonymously with the term "including" and variations thereof and are open, non-limiting terms.

The details of one or more embodiments are set forth in the accompanying drawings and the description below. Other features and advantages will be apparent from this disclosure and from the claims.

BRIEF DESCRIPTION OF THE DRAWINGS

In FIG. 1a, no output port is provided for the input signal, unlike the case in FIG. 1b where an output port is provided.

FIG. 3 is a schematic of an embodiment similar to that shown in FIG. 2c, except that multiple optical microresonators are cascaded in FIG. 3 to increase the overall efficiency of the photodetector.

FIG. 4a shows a regular 1 GHz bit-rate signal train that is sent to an integrated photodetector. FIG. 4b shows the corresponding absorbed power $P_{abs}$ in the microcavity. FIG. 4c shows the change in the refractive index $\Delta n$ of the microcavity due to the absorbed power. The responses of the same integrated photodetector to a pseudorandom train of optical signals (the temporal profile of this signal train is shown in FIG. 4d) are correspondingly shown in FIGS. 4e and f.

Like reference symbols in the various drawings indicate like elements.

DETAILED DESCRIPTION

Disclosed is an apparatus and method suitable for use as an all-silicon integrated detector to convert optical signals into electrical signals via the nonlinear process of two-photon absorption. This apparatus and method can be used, for example, in telecommunications and silicon photonics.

An integrated photodetector that is composed entirely of silicon is attractive due to well-established fabrication techniques for processing silicon, such techniques can be exploited to readily implement the photodetector in a CMOS platform.

Figure 1A:
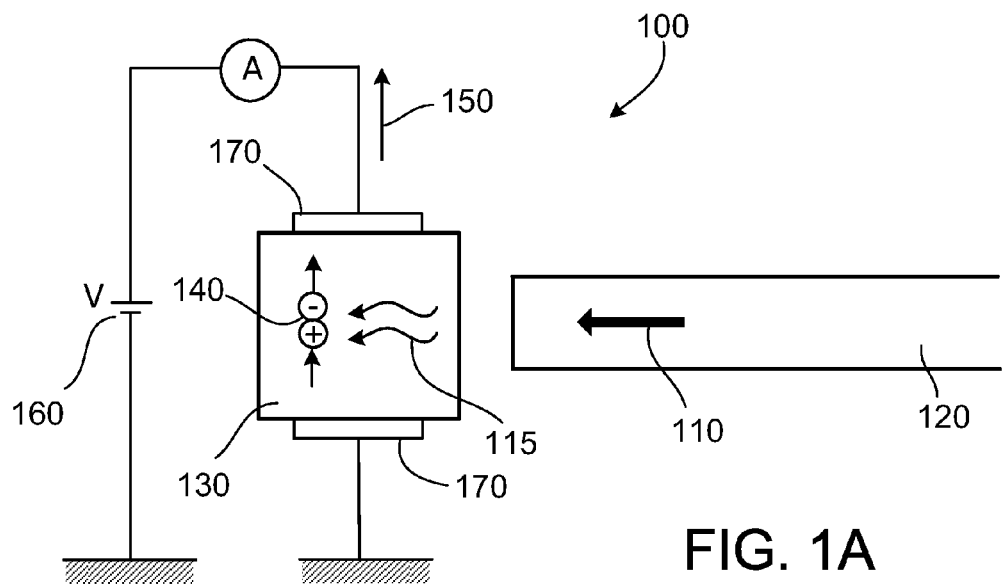
FIG. 1a and FIG. 1b each show a schematic layout of an integrated silicon-based nonlinear photodetector, including an external circuit through which the electrical signal can be characterized.
Figure 1B:
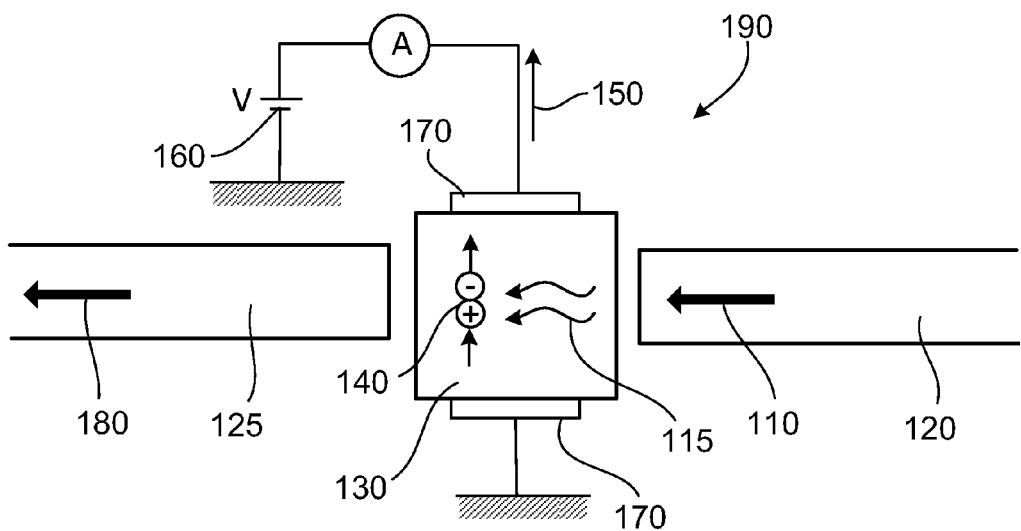

FIGS. 1a and 1b show two different schematic representations of the apparatus. In the first embodiment of an integrated silicon-based detection system 100 shown in FIG. 1a, an input signal light 110 is carried by an optical waveguide 120, which is optically coupled to an optical microresonator 130. As described further below, in preferred embodiments, both the optical waveguide and the optical microresonator are formed in a silicon-based integrated structure. Upon optical coupling of the signal light into the optical microresonator, the optical energy if the coupled light 115 is absorbed by a nonlinear multi-photon absorption process in the silicon in the microresonator to create free carriers 140. These free carriers can be detected, for example, as a photocurrent 150 that flows in an external circuit when an external voltage 160 is applied across a pair of electrodes 170 adjacent to the optical microresonator. The role of the reversed biased p-i-n junction formed at the optical microresonator by the external voltage 160 is twofold. Besides enabling the electrical readout of the optical signal, the reversed biased p-i-n junction also allows the free carriers generated inside the microresonator to be swept out, when a large enough voltage is applied to the junction. This substantially reduces the optical loss induced by free carrier absorption (FCA), thereby improving the overall performance of the detection system 100.

In another embodiment, an integrated detection system 190 comprising all the elements illustrated in FIG. 1a is shown in FIG. 1b. What distinguishes the apparatus shown in FIG. 1a from that shown in FIG. 1b is the presence of an additional dedicated optical output port, positioned after the optical microresonator 130. Such an output port can be implemented, for example, in the form of another optical waveguide 125, as shown in FIG. 1b. This optical output port enables the transmission of an output signal light 180 that has not been absorbed by the microresonator to be reutilized in a different part of the chip.

Both embodiments of the apparatus shown in FIGS. 1a and 1b can be used as an in-line detector, wherein only a portion of the optical signal light is picked off for analysis. Such analysis can include the monitoring of optical power levels, for example, in one or more different channels in an optical communications network, or the conversion of the optical signal light into electrical signals. In addition, the disclosed apparatus can also be used for Optical Performance Monitoring (OPM) on an all-silicon platform. In general, OPM devices are similar to photodetectors but instead of monitoring the complete and exact bit sequence of a train of optical signals, they perform a comprehensive assessment of the optical signal quality. For more information regarding OPM, see: S. Wielandy et al., J. of Lightwave Tech., 22, 784-793 (2004).

In addition, the apparatus disclosed in FIG. 1a can also be used expressly as an end-point detector for conversion of optical signals into electrical signals.

Figure 2A:
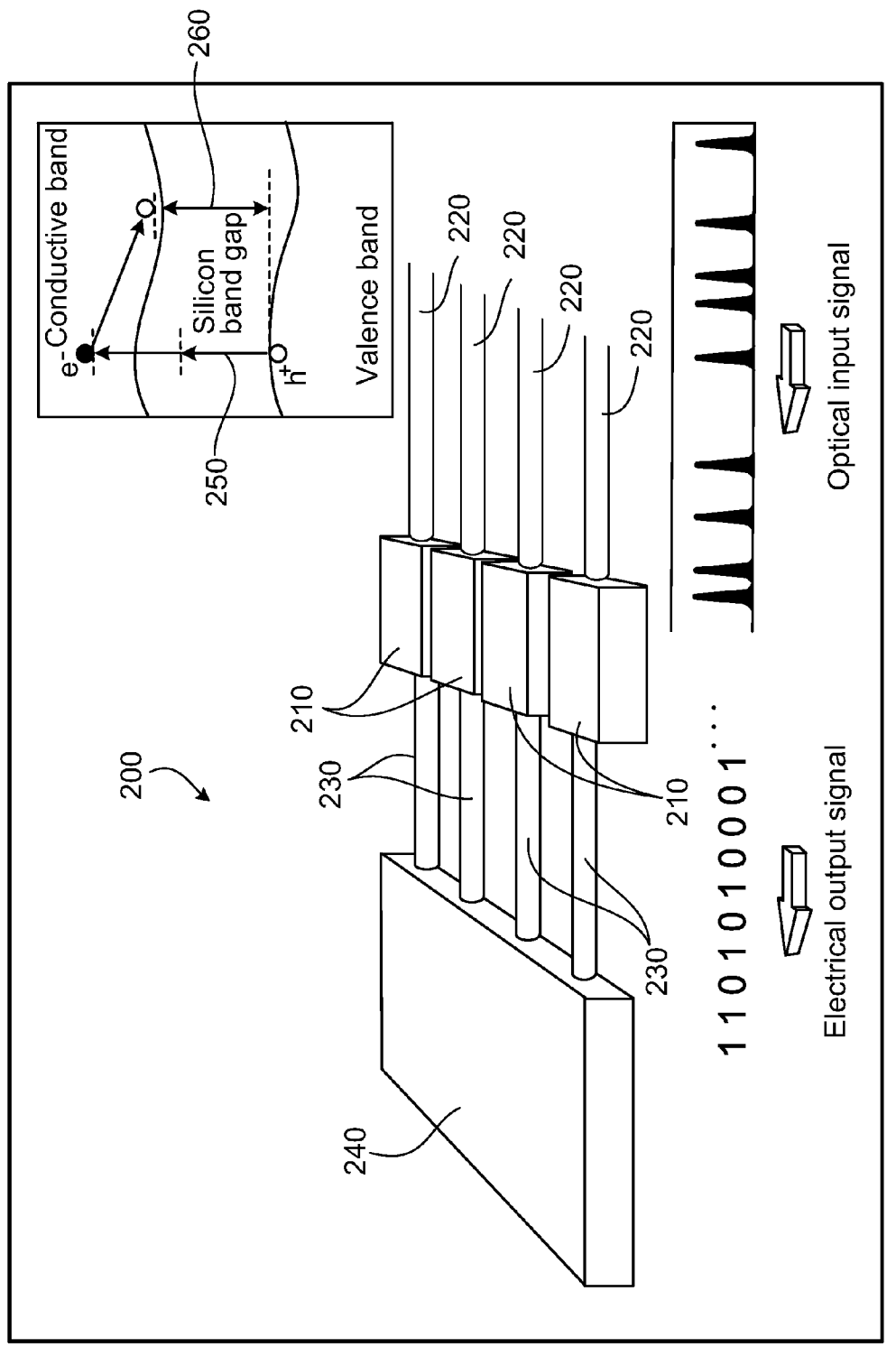
FIG. 2a shows an overall illustration of an array of all-silicon photodetectors working in parallel. The inset of FIG. 2a illustrates the two-photon absorption process (TPA) in silicon.

FIG. 2a shows a schematic illustration of a possible on-chip integration of the photodetector 200. Even though the system depicted in FIG. 2a comprises an array of four all-silicon photodetectors 210, the disclosed apparatus is in no way constrained to operate solely in a multiplex mode for simultaneous detection of optical signal across multiple channels. It does, however, illustrate how readily the disclosed apparatus can be incorporated into, for example, an extensive, multi-channel telecommunication network. Nonetheless, a single all-silicon based photodetector 210 is sufficient by itself to convert an arbitrary train of ultrafast (~10 Gbit/s) and ultralow energy (~1 pJ) light pulses 220 into an electric binary code 230 (represented as a set of 1's and 0's in the figure). The electrical signal is then fed into receiver chip 240, which forms part of a standard electronic circuit.

In certain embodiments of the apparatus disclosed here, the nonlinear multi-photon absorption process can be two-photon absorption (TPA). The inset of FIG. 2a shows a sketch of the two-photon absorption (TPA) process that is employed as the basis for this photodetection scheme. The absorption of one photon in the telecommunication band (1.55 μm or 0.8 eV, the magnitude of which is depicted by the length of arrow 250) in silicon, which has an indirect electronic bandgap 260 of 1.1 eV is insufficient to cause a valence electron, e⁻, to be promoted into the conduction band to become a free carrier, while leaving a positively charged hole, h⁺, in the valence band. In TPA, two 0.8 eV photons are absorbed simultaneously by silicon, the sum of the energy of these two photons is now larger than the bandgap of silicon, allowing a valence electron to be liberated as a free carrier. Because TPA relies on nonlinear interactions between the optical field and silicon, TPA is proportional to higher orders of optical intensity. Nonlinear effects like TPA can therefore only be observed in the regime of high optical fields.

In order to obtain dramatic enhancement of the optical field to achieve TPA, modest optical fields typically used in telecommunications and silicon photonics are optically coupled from an optical waveguide into an optical microcavity or a photonic crystal structure, in the apparatus and method disclosed herein.

Details regarding optical coupling, optical microcavities, and parameters related to the description of optical microcavities are given below.

Optical coupling describes the transfer of energy among electromagnetic modes whose respective electromagnetic fields overlap with one another both in space and frequency. Evanescent optical coupling (a particular type of optical coupling) between a waveguide mode and a microresonator mode is used to transfer energy from the optical waveguide to the optical microresonator in certain embodiments of the photodetector. Specifically, the evanescent optical coupling involves coupling between the confined modes in the waveguide and microresonator, respectively, because an evanescent portion of the mode confined to the waveguide extends into the microresonator, and vice-versa with respect to an evanescent portion of the mode confined in the microresonator extending into the waveguide.

One component of the all-silicon nonlinear detector is the optical microresonator. An optical microresonator (or optical microcavity, which terms are used interchangeably herein) is as a structure that confines electromagnetic energy, both spatially and temporally, by resonant recirculation of light, in such a way that the electromagnetic energy is trapped for many optical periods in a volume in which one or more spatial dimensions are of the size of a few wavelengths of light or smaller. Parameters relevant to the microcavities are the quality factor Q, resonant frequency $\omega_0$, and modal volume $V_{mode}$.

The frequency of the electromagnetic wave confined inside the optical microcavity or optical microresonator is termed the resonant frequency $\omega_0$. Another parameter of an optical microcavity is the quality factor Q, defined as $$Q = \omega_0 \frac{\text{Electromagnetic field energy stored by microresonator}}{\text{Power dissipated by microresonator}} \quad (1)$$

where $\omega_0$ is the resonant frequency. The magnitude of the Q-factor indicates how well the optical microresonator can store optical energy.

The definition of the modal volume employed here is given by the following expression $$V_{MODE} = \frac{\left(\int d\vec{r} n^2(\vec{r})|\vec{E}(\vec{r})|^2\right)^2}{\int d\vec{r} n^4(\vec{r})|\vec{E}(\vec{r})|^4} \quad (2)$$

where $n(\vec{r})$, $E(\vec{r})$ stand for the refractive index and the electric field, respectively, at position $\vec{r}$ in the structure.

With respect to nonlinear effects, TPA is not the only nonlinear phenomenon that can occur in the microcavity. In particular, free-carrier absorption (FCA) can also be included in the description of the system. TPA and FCA introduce two nonlinear absorption mechanisms into the optical microcavity, and their respective rates scale as $Q^2/V_{MODE}$ and $Q^2/V_{MODE}^2$ (for more information, see: S. F. Preble et al. Opt. Lett. 30, 2891-2893 (2005)).

The presence of free carriers further influences the response and optical properties of the microcavity. For instance, the steady-state population of the electron-hole free carriers generated by TPA modifies the refractive index of the microcavity (a phenomenon known as free carrier dispersion, FCD), blue shifting the resonant frequency of the microcavity. In contrast, the population of phonons generated via relaxation processes (both of interband and intraband character) of the free carriers produced by TPA gives rise to a red shift of the resonant frequency $\omega_0$.

Another feature of the integrated photodetector is the optical waveguide. In general, an optical waveguide is a structure that transports electromagnetic energy between two different locations using a physical mechanism that enables electromagnetic energy confinement. In certain embodiments, a dielectric waveguide in which the physical mechanism for electromagnetic energy confinement is total internal reflection can be used (e.g. regions of higher dielectric index material surrounded by a lower dielectric index material). Other types of optical waveguiding mechanism can also be implemented.

There are several ways to construct suitable optical waveguides and optical microcavities. In certain embodiments one or both of such structures can be constructed as, for example, regions of higher dielectric index material surrounded by a lower dielectric index material, such as is typical in optical fibers or planar waveguides. In other embodiments, one or both of such structures can be part of a photonic crystal structure.

Photonic crystals are structures having a periodic variation in dielectric constant. One description of photonic crystals is that the solutions for propagating electromagnetic (EM) modes within the periodic structure give rise to a photonic "band" structure, in which propagating EM modes having frequencies within a "photonic bandgap" cannot exist within the periodic structure. This band theory for EM waves is analogous to the band theory developed for electrons in crystals.

In other applications, a photonic crystal includes a series of defects that combine to form a waveguide within the photonic crystal. The series of defects support EM modes having frequencies within the photonic bandgap that can propagate along the series of defects but are otherwise confined to regions of the photonic crystal in the vicinity of these defects. Defect-based waveguides in photonic crystals can include sharp turns since the photonic bandgap can prevent propagation of the EM radiation away from the waveguide for at least some, if not all, propagation directions. Further description of photonic crystals can be found in, for example, Nelson et al. in U.S. Pat. No. 5,999,308, the contents of which are incorporated herein by reference.

Figure 2B:
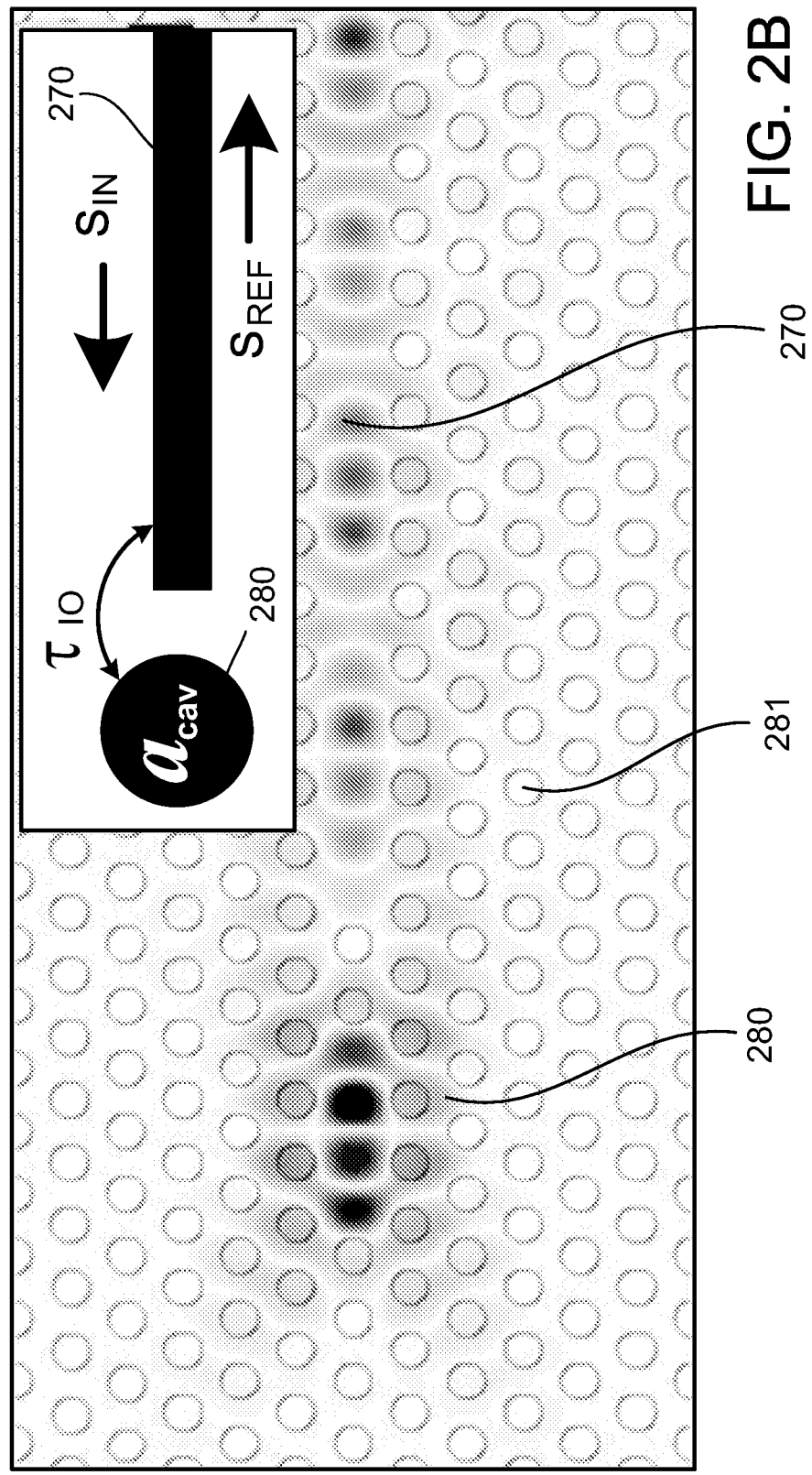
FIG. 2b and FIG. 2c show two different physical implementations of the integrated silicon nonlinear photodetector. The schematics shown in the inset of each of the FIGS. 2b and 2c depict certain parameters and schematic illustrations of the two implementations.

FIG. 2b shows a physical implementation of an embodiment of the all-silicon nonlinear photodetector 210 depicted in FIG. 2a, without the electrodes and other standard electronic components shown in FIGS. 1a and 1b. The gray pattern with different shading intensities depicted in the middle of the figure represents the spatial distribution of the electromagnetic field intensity across the photodetector 210. A silicon photonic crystal (PhC) microcavity 280 is implemented in a hexagonal lattice of air holes 281 in silicon. For ease of visual interpretation, the boundary of the hexagonal lattice is marked with dashed lines to denote the PhC microcavity 280. Exemplary dimensions for the radius of the holes r, is 90 nm, while the periodicity of the lattice, d, can for example be 330 nm. These geometric parameters of the PhC microcavity influence the quality factor Q of the microcavity and also determine the resonant frequency $\omega_0$. In particular, dimensions of the microcavity are chosen to have one or more spatial dimensions of the microcavity be the size of a few wavelengths of light or smaller. This enables signal light at the resonant frequency $\omega_0$ to be confined effectively, increasing the Q-factor of the microcavity.

The hexagonal lattice of air holes 281 in the silicon define a photonic bandgap structure that prevents electromagnetic modes having a frequency in the photonic bandgap from propagating through hexagonal lattice. In other words, there are no modes having a frequency in the photonic bandgap that have a real-valued wavenumber. The PhC microcavity is formed by a region of defects in the hexagonal lattice. For example, microcavity 280 in FIG. 2b is formed by a region in the silicon where the air holes 281 are absent. As a result, microcavity 280 can support propagating electromagnetic modes having a frequency in the photonic bandgap; however, such modes are substantially confined to the microcavity because of the photonic bandgap formed by the surrounding air-hole lattice structure. An evanescent component of the confined electromagnetic modes extends beyond the microcavity and provides a basis for coupling between microcavity 280 and any nearby microcavities and/or waveguides. Moreover, as explained in greater detail further below, because the electromagnetic modes are substantially confined to the microcavity and because the dimensions of the microcavity are set to be comparable the wavelength of the confined modes (and further because of the large quality factor (Q), and the small modal volumes $V_{MODE}$), the peak optical field intensity inside the microcavity can become very large, giving rise to nonlinear optical effects like TPA that are otherwise not observed at modest optical power.

An optical waveguide 270 is formed in the area on the Si slab without the air holes. Once again, as a visual aid the area comprising the optical waveguide 270 is demarcated as a rectangle with dashed perimeter, as shown in FIG. 2b. The dimension of this waveguide is defined by the boundary of the air holes bordering it. In the particular configuration (where the waveguide acts simultaneously both as an input and output port) shown in FIG. 2b, the photodetector can be optimized, by a judicious choice of geometric parameters for the size of air holes, the size of the PhC microcavity 280, the separation between the microcavity 280 and the waveguide 270 so that the decay rate of the optical microresonator into the waveguide matches the nonlinear absorption rate of the optical signal light in the microresonator. In certain embodiments, this can lead, in principle, to the complete absorption of the incident power, through a general mechanism often described as "Q-matching".

The inset of FIG. 2b shows the pertinent parameters and magnitudes of the all-silicon photodetector 210. $S_{in}$ is the input signal light carried by the optical waveguide 270 portion of the integrated all-silicon photodetector 210. When operating in the configuration in which the optical waveguide 270 acts both as the input and output port, the output light signal $S_{ref}$ is carried also relayed by the optical waveguide 270 out of the photodetector 210. $\tau_{IO}$ denotes the coupling rate between the optical microcavity 280 and the waveguide 270, while $\alpha_{cav}$ is the electric field amplitude inside the microcavity. The embodiment depicted in FIG. 2b can be implemented in silicon using well-established semiconductor manufacturing techniques for silicon.

The physical implementation of another embodiment of the all-silicon nonlinear photodetector 210 is shown in the main panel of FIG. 2c, again without the electrodes and other standard electronic components shown in FIGS. 1a and 1b.

Figure 2C:
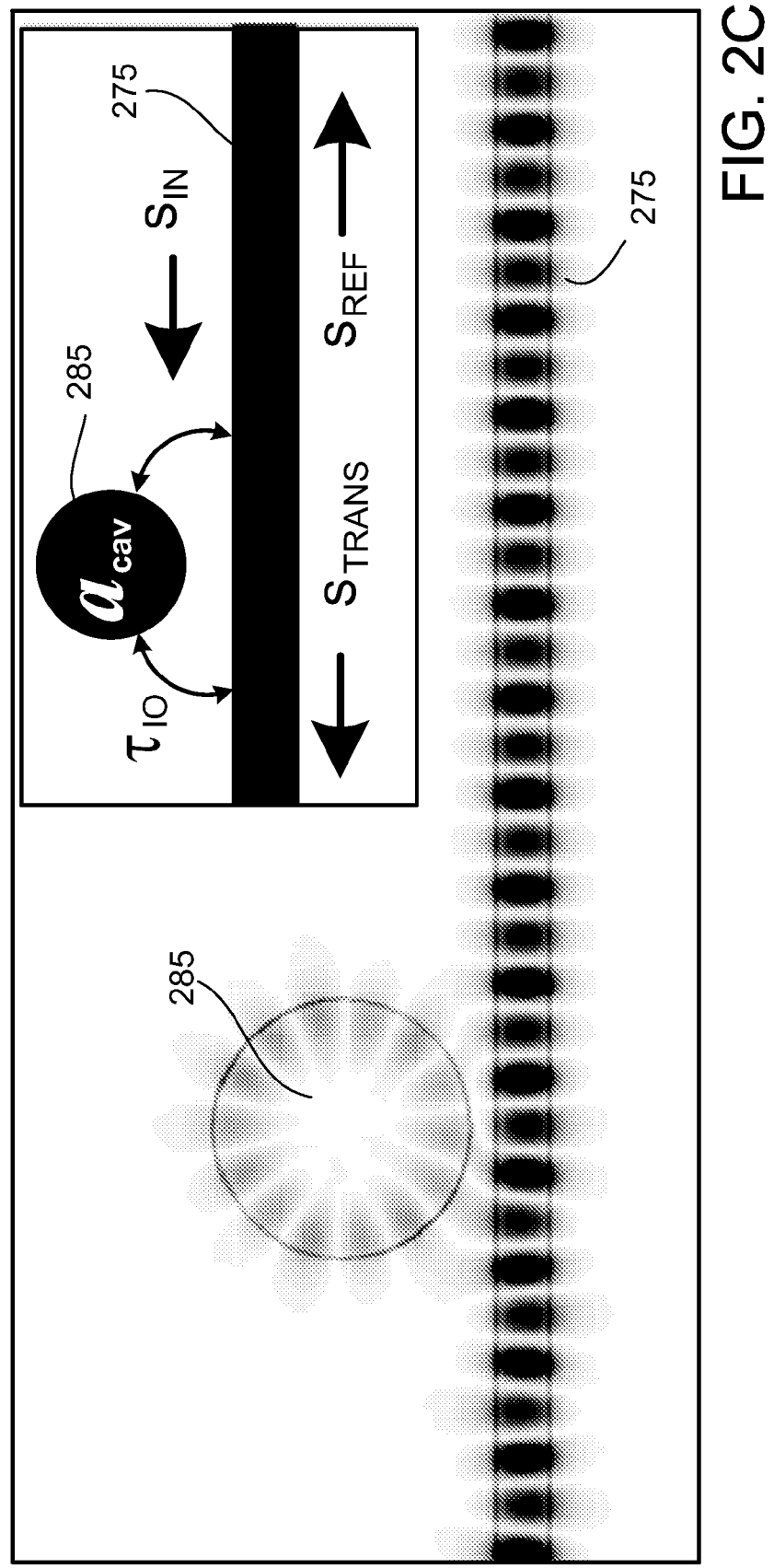

The device in FIG. 2c consists of a dielectric optical waveguide 275 coupled to an optical disk microresonator 285. In the presently described embodiment, both elements are composed of silicon. In general, the device shown in FIG. 2c can be implemented with any high index material being surrounded with a low index material. Besides having both 275 and 285 be composed from silicon, and separated by air (the low index medium), the structure can also be implemented by patterning and depositing the silicon (the high index medium), and surrounding the silicon with some other solid, lower-index material (such as $SiO_2$). In either case, the silicon waveguide and microcavity can be grown on a substrate of $SiO_2$ using well-established semiconductor manufacturing techniques. As an example, the structure can be formed with 1000 nm of $SiO_2$, on which 200 nm of silicon is patterned and deposited. In the structure shown in FIG. 2c, an exemplary width of the waveguide and an exemplary radius of the disk of w=290 nm and $r_d$=730 nm, respectively, can be chosen. As described in the preceding figure, the modulating gray pattern depicted in the structures 275 and 285 shows the spatial variation of the electromagnetic field intensity across the device. This spatial depiction of the electric field clearly demonstrates the optical coupling (through evanescent coupling) between the waveguide 275 and the microcavity 285.

The limited spatial dimensions of the components 260, 270, 275, and 285, as explained earlier, enhance the nonlinear effects that occur in a microcavity. The exemplary geometrical parameters used in FIGS. 2b and 2c have been chosen to tune the resonant wavelength of a TM resonant mode of the optical microcavity or the disk to 1.55 µm, the telecommunication wavelength. While the apparatus shown in FIG. 2c is well suited for use in Optical Performance Monitoring (OPM), the apparatus shown in FIG. 2b can also be used.

The kind of symmetric structure shown in FIG. 2c can also operate in the linear regime as a so-called all-pass filter, in which 100% transmission can be achieved for all frequencies. In the linear regime, the signal light intensity is below the threshold intensity required for free carriers creation via TPA in the microcavity. All signal light that is optically coupled into the microcavity is coupled back out into the waveguide without any loss.

In the inset of FIG. 2c, all features are similar to those shown in the inset of FIG. 2b, the difference being a longer waveguide 275 that can also be used to carry the transmitted output signal $S_{trans}$, coupled out from the microcavity 285, in the same direction as the incoming light signal $S_{in}$. The reflected signal $S_{ref}$ carries some of the signal light back in the direction along which the incoming light signal originates.

FIG. 3 is similar to FIG. 2c except for the incorporation of multiple optical microcavities, shown schematically as 285, 286, 287, 288, and 289 in the integrated photodetector 210. The same numerals are used for equivalent structures in FIGS. 2c and 3. Once again, electrodes and other standard electronic circuit components are not shown here. Even though five microcavities are depicted in FIG. 3, it is not a limitation to how this embodiment can operate. Any number of microcavities, appropriate for the photodetector system, can be cascaded in this manner. The cascaded design can increase the overall conversion efficiency of the photodetection system. More than one microcavity (285, 286, etc) is optically coupled to the waveguide 275 in a cascaded manner. The microcavities are all arranged at the same distance away from the plane of the waveguide, equally spaced from one another, and optically coupled to the waveguide to receive optical energy from the input beam $S_{in}$. The arrows in FIG. 3 indicate the direction of propagation of the optical signal light.

The input beam ($S_{in}$) is guided along the waveguide 275 and optically couples into the first optical microcavity 285. Part of the optical signal light confined in the optical microcavity is absorbed through TPA to create free carriers. The remainder of the unabsorbed optical signal light is optically coupled, without significant losses from the first microcavity, back into the optical waveguide, as shown by the arc-shaped arrows. The out-coupled optical signal 310 propagates for some distance in the optical waveguide, before the optical signal is optically coupled into a second microcavity 286. The second microcavity, located further along in the direction of propagation of the optical light in the waveguide, is arranged at the same distance away from the waveguide as is the first microcavity. Part of the optical light confined in the second microcavity is absorbed via TPA to generate free carriers. The second optical cavity enables more free carriers to be generated from $S_{in}$. When electrodes are placed across each of the microcavity (285 and 286), the sum of the electrical signals detected will be greater than that detected when only one microcavity (e.g. 285) is used alone. The efficiency of a system with two microcavities is therefore higher than a system with only one microcavity. A photodetection system can employ one or more (two or more, three or more, four or more, five or more, etc.) of these microcavities to achieve a target efficiency.

If higher efficiency than that afforded by two microcavities (e.g. 285 and 286) is desired, the out-coupled optical light signal 320, which is not absorbed by the second microcavity 286, can be coupled into a third microcavity 287. The output light signal that has interacted with all the microcavities designed for the system is denoted by $S_{trans}$. It should be noted that when the photodetector 210 is operating in the cascaded mode, the input signal light interacts with all the microcavities that are placed within the evanescent coupling range of the waveguide. However, none of the microcavities interact with each other. Each microcavity operates sequentially, to generate part of an aggregate electrical signal, the sum of which is larger than the signal would be in the non-cascaded case.

In order to obtain accurate information about system performance through the temporal response of the apparatus disclosed herein, in which the time-dependent interplay between all different optical and thermal effects plays a role, a theoretical framework based on a combination of a coupled mode theory (CMT) and a first order perturbation theory is applied. This approach offers an intuitive universal description (i.e., independent of the particular geometry under analysis) of the structures displayed in FIGS. 2b and 2c. Furthermore, it can be shown that the CMT description of the two different geometries shown in FIGS. 2b and 2c can be written in the same manner (despite the absence of any transmitted power in the system rendered in FIG. 2b). The results for the corresponding nonlinear absorption are thus the same in both cases. The specific details of the electric field distribution of each one of these systems are accounted for through a set of parameters introduced into the CMT theory. Hence, without a loss of generality, the results computed for the electric field distribution shown in FIG. 2b are emphasized.

In particular, a parallel implementation of finite-difference-time-domain (FDTD) method is used to compute both the electric field profiles shown in FIGS. 2b and 2c and their corresponding quality factors. Details of both the theoretical framework and the computational method are provided after the system performance is presented.

FIGS. 4a-f summarize the calculated system performance and characteristics for a system with the electric field distribution shown in FIG. 2b, assuming $Q=10^5$. An effective lifetime of the carriers and a heat relaxation constant of 80 ps and $\tau_{th}=50$ ns, respectively are used for the system, as these parameter values are typical for this class of microresonators. The heat relaxation constant $\tau_{th}$, is defined as the average time in which (in the absence of any source of heat input into a system) the temperature of a system is reduced through radiation, convection, and conduction processes by a factor of $1/e=0.3679$.

Apart from the quantum efficiency, the power absorbed by the TPA ($P_{abs}$) provides an accurate measure for the conversion efficiency between the light pulses and electrical signals. In other words, once the electrons are generated via TPA, they represent an electronic signal in the circuit (represented by 14 in FIG. 1a), in the same way as in any conventional photodetector based on linear absorption. In these calculations and the figures summarizing their results shown below, $P_{abs}$ only accounts for absorption from TPA processes (i.e., the power absorbed due to FCA is not included).

System Performance with a 1 GHz Optical Signal Train

FIGS. 4a-c show a first set of simulations of the temporal response of the disclosed apparatus in which a continuous train of 0.25 ns-duration light pulses is sent down the waveguide. The time interval between the pulses is 1 ns and the carrier frequency is the same as the resonant frequency $\omega_0$ of the microresonator. When the energy of the first pulse of the train sequence starts coupling into the microresonator (t=0), the effects of the nonlinear absorption begin to increase, as shown in FIGS. 4a and 4b. Since the times over which the variation of the refractive index of the microresonator, $\Delta n$, changes appreciably are much longer than the duration of each pulse, the temporal profile of the absorbed power $P_{abs}$ follows the one corresponding to the input pulse. The optical absorbed power raises the temperature of the structure by $\Delta T(t)$, which in turn introduces a shift $\Delta n(t)$ of the refractive index of the microresonator (the contribution to $\Delta n$ coming from the heating of the microresonator is the dominant mechanism determining $\Delta n$).

For times $t<<\tau_{th}$, the increase of the temperature in the optical microresonator induced by each one of the subsequent pulses of the input train is added up, giving rise to the staircase-like profile of $\Delta n(t)$ displayed in the inset of FIG. 4c. The plateau regions in the inset (e.g. the time interval between 1-2 ns, 2-3 ns, and 3-4 ns) correspond to the time interval between light pulses, during which the device does not have enough time to shed its thermal energy via thermalization with the environment. As can be seen in FIG. 4c, the growth of $\Delta n(t)$ saturates after approximately 100 ns.

In a similar manner, the maxima of $P_{abs}(t)$ decrease with time, until a steady-state value of 0.03 mW is reached at ±100 ns, which corresponds to ±20% of the maximum input power. In the case of the structure displayed in FIG. 2c, the pulses are transmitted through the system largely unperturbed when the apparatus is operating in the linear all-pass filter regime, and the signal pulses can consequently be reutilized in a different part of the chip. The peak value chosen for $P_{in}(t)$ ($P_{in}^{max}=0.15$ mW) in FIGS. 4a-c has been optimized to obtain the best possible ratio between the absorbed and input energies (i.e., the best conversion efficiency of the TPA process).

System Performance with a Pseudorandom Sequence of a 1 Ghz Optical Signal Train

In the second set of numerical experiments, the response of the system to a pseudorandom train of 0.25 ns pulses is analyzed. Pseudorandom sequences of signals are routinely employed to test electronic integrated circuits. Therefore, the use of this kind of sequences enables a more rigorous assessment of the performance of the photodetector. The results of the computations are displayed in FIGS. 3d-f. The same physical parameters as those used in FIGS. 4a-c are assumed in this set of simulations. The physical description of the behavior observed in FIGS. 4d-f is similar to the one given above for the case of a continuous train of pulses.

Factors Influencing System Performance

1. Interplay Between $\Delta n(t)$ and $\tau_{th}$

Two intertwined effects cause the behavior observed in FIGS. 4b and c. On one hand, $\Delta n(t)$ produced by the temperature rise in the microresonator modifies the resonant frequency of the microresonator, which in turn, feeds back and reduces the optical power that is coupled into the microresonator by the subsequent pulses, decreasing the optical absorption and therefore the rate of growth of $\Delta T(t)$. On the other hand, after a time comparable to the heat relaxation constant ($\tau_{th}=50$ ns), the optical microcavity starts to exchange thermal energy with its surroundings in a significant way. Both of these mechanisms influence one another until the microresonator reaches an approximate thermal steady-state ($\Delta n \approx 3.6 \times 10^{-6}$ and $\Delta T \approx 0.5K$ in this case).

2. Preshift $\Delta \omega$

Figure 4:
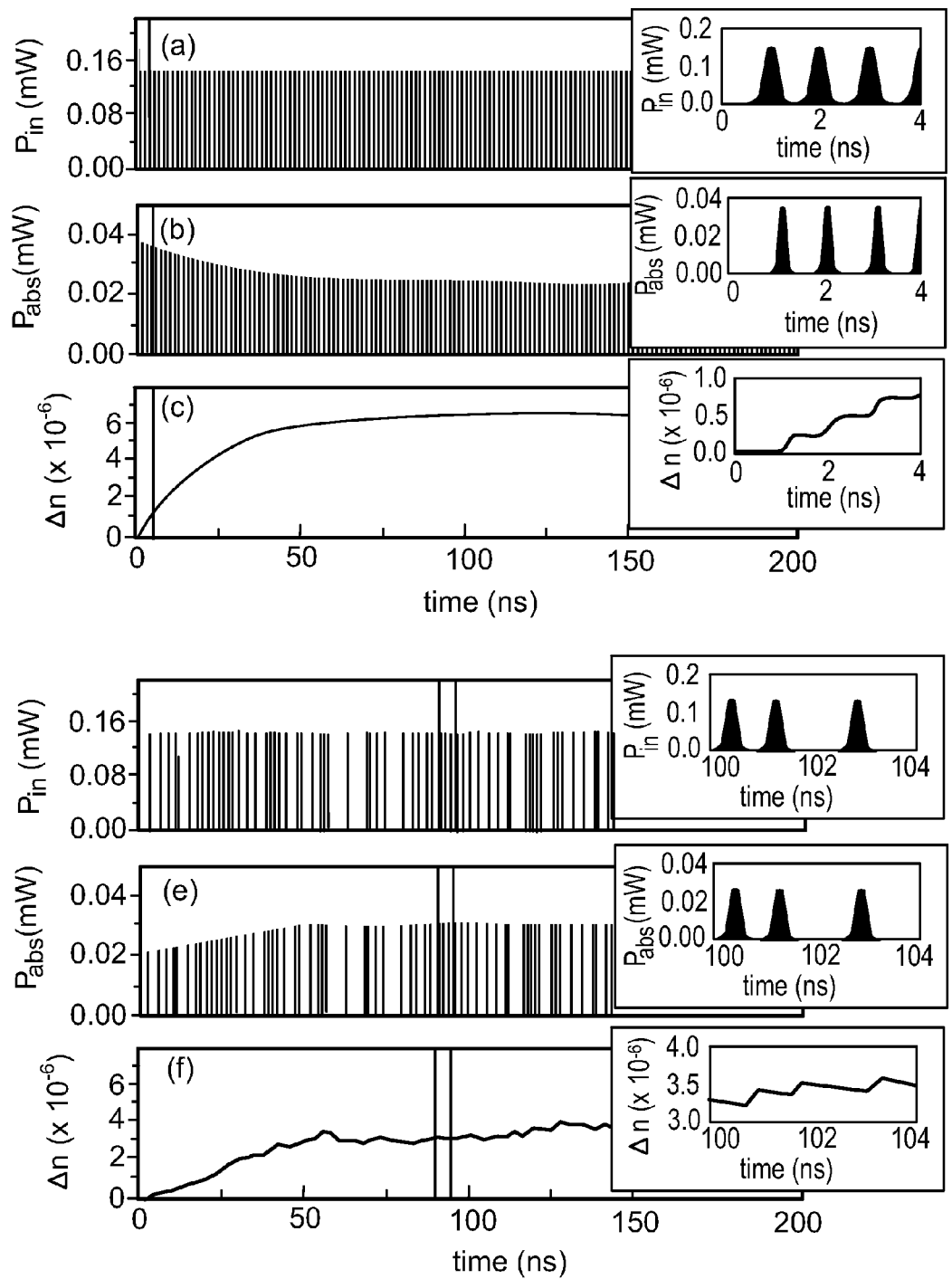
FIGS. 4a-f show time-dependent responses of an optical microresonator to different sequences of input light pulses.

In contrast to the results shown in FIGS. 4 a-c, a preshift do has been introduced into the frequency of the input signal used in the calculations shown in FIGS. 4e-f, so the signal carrier frequency $\omega$ is not the same as the resonant frequency $\omega_0$ of the microresonator. The typical absorbed power can be improved by choosing $\Delta \omega = -\omega \Delta n_c$, where $\Delta n_c$ is the steady-state value of the $\Delta n(t)$ obtained from the former set of simulations corresponding to a continuous train of pulses (see FIGS. 4a-c).

In the system depicted by FIGS. 4d-f, as the microresonator absorbs optical energy, the shift of the refractive index (or equivalently the shift of the resonant frequency) induced by the warming of the system starts to compensate the original input preshift $\Delta \omega$, producing an increase in the maxima of $P_{abs}(t)$ with time (see FIGS. 4e and 4f). The result is a steady-state in which the system improves the self-alignment of its resonant frequency with that of the external source, producing an increase in the absorbed power once the system reaches the approximate thermal steady-state. Thus, for instance, if the average power of the considered pseudorandom sequence were the same as the one corresponding to the periodic sequence displayed in FIG. 4a, this self-alignment would be nearly optimal. As shown in FIG. 4e, values for the maxima of $P_{abs}(t)$ between 0.021 and 0.031 mW are achieved in this case. It should be noted that since in a pseudorandom train of pulses the time interval between consecutive pulses changes with time, the maxima of $P_{abs}(t)$ of various pulses varies, even for times longer than the heat relaxation constant of the structure.

3. Pulse Energy and Q-Factor

Figure 5:
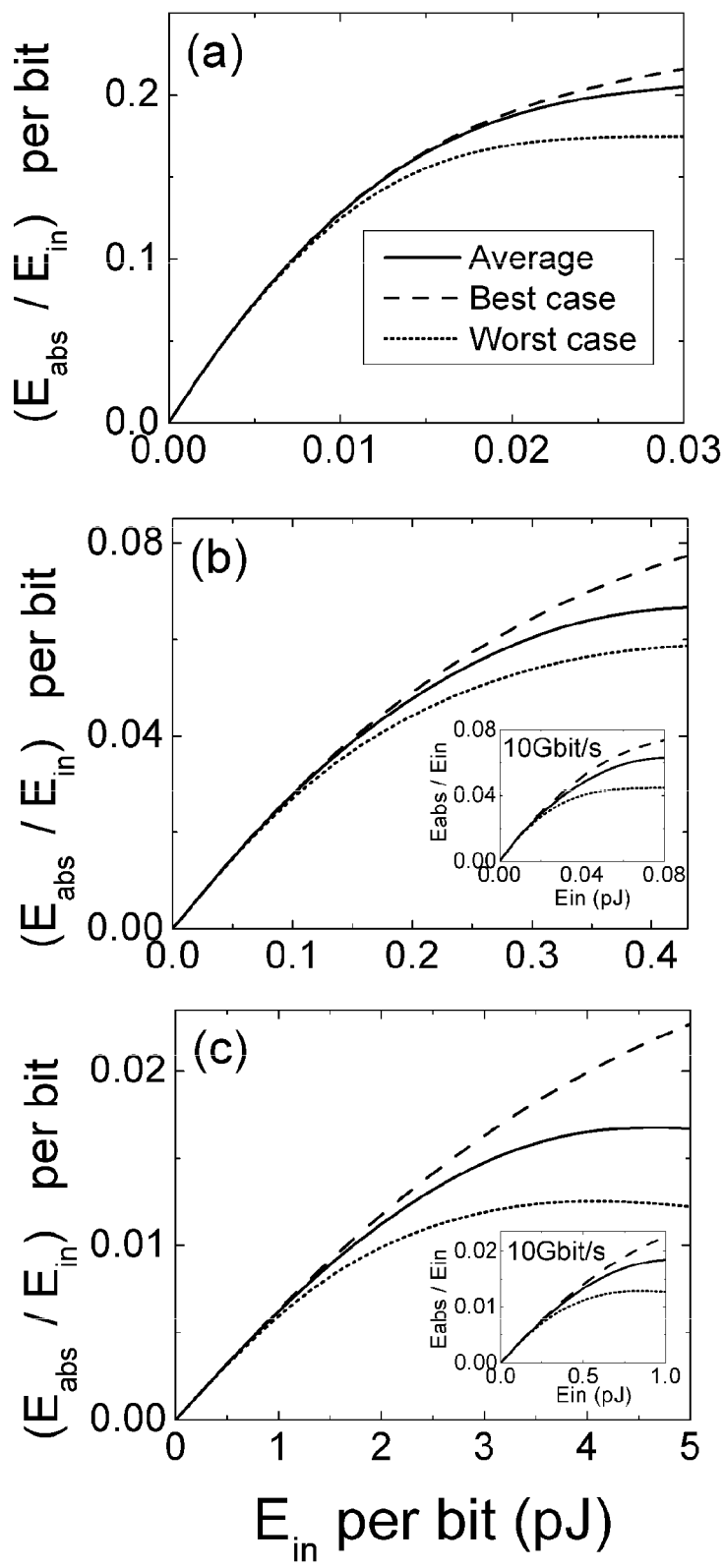
FIGS. 5 a-c show the plots of conversion efficiency $E_{abs}/E_{in}$ as a function of the energy input per bit for optical microresonators with different Q-factors. The insets in FIGS. 5b and 5c magnify the regions of each plot close to the intersection of the two plotting axes.

In order to quantitatively analyze the mentioned variation of $P_{abs}(t)$ over long time periods, the dependence of the energy absorbed per pulse, $E_{abs}$, as a function of the energy of each input pulse $E_{in}$, is shown in FIG. 5. Note that for $Q=10^5$, values of $E_{abs}/E_L$, up to 0.15 can be reached for input pulse energies of 0.015 pJ without any significant difference between the most and the least absorbed pulses. Additionally, FIG. 5 provides a complete picture of the overall performance of the photodetection scheme, providing universal design guidelines for the photodetection approach.

4. Thermal Relaxation Constant $\sigma_{th}$

Figure 6:
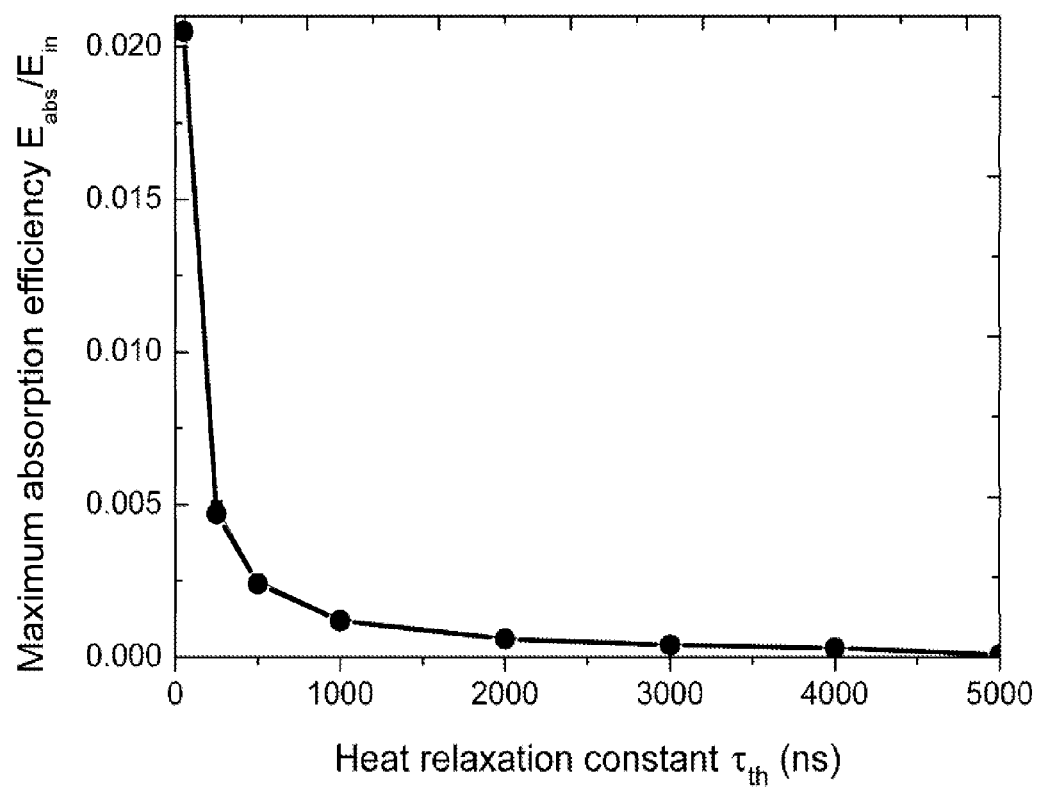
FIG. 6 is a plot of the maximum absorption efficiency per bit as a function of the heat relaxation constant $\tau_{th}$.

The range of values for the maximum absorption efficiency, $E_{abs}/E_L$, that enables the practical implementation of the photodetection scheme disclosed here can only be achieved using optical microresonators characterized by a small enough thermal relaxation constant $\tau_{th}$. This fact is illustrated in FIG. 6, for a system with $Q=10^5$ where the maximum value for $E_{abs}/E_{in}$ per bit is plotted as a function of the thermal relaxation constant $\tau_{th}$. The figure shows that the performance of the photodetector decreases drastically as $\tau_{th}$ becomes larger. Moreover, as it can be shown that $\tau_{th}$ increases with the modal volume of the optical microresonator, only microphotonic structures able to confine light into subwavelength volumes (as those shown in FIGS. 2b, 2c, and 3) are suitable for this class of devices.

An Embodiment of the Apparatus for Operation in the Continuous-Wave Regime

Besides the embodiments of the photodetector detailed above which are able to detect a train of ultrafast optical pulses, continuous wave (cw) optical signals can also be detected by the systems disclosed here.

Figure 7:
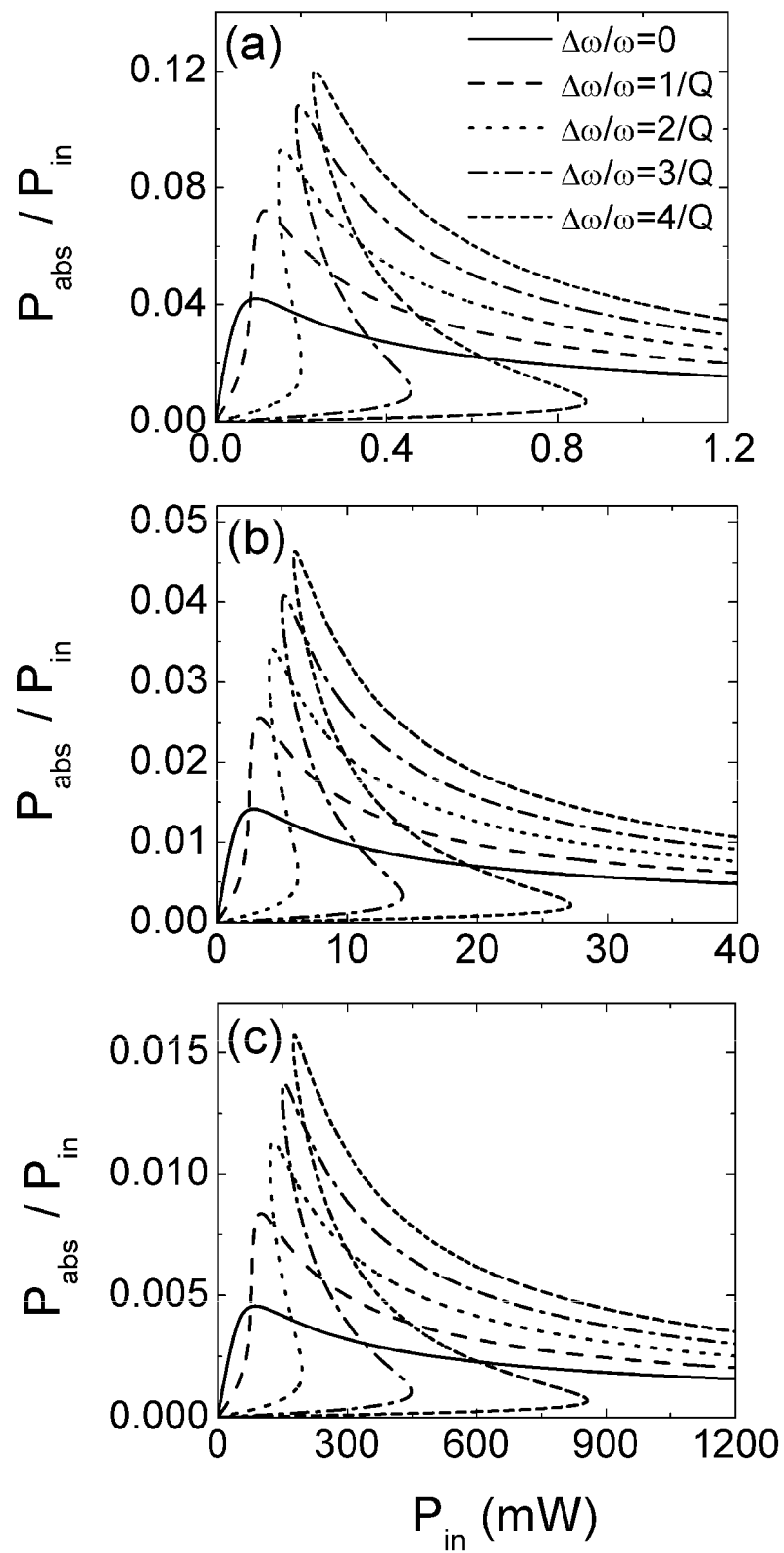
FIGS. 7 a-c shows plots of the continuous-wave regime power conversion efficiency as a function of the input power for different Q-factors. The behavior of the microcavity under different levels of preshift $\Delta\omega$ (displayed as a ratio $\Delta\omega/\omega$) is also shown.

FIG. 7 displays the dependence of the ratio between the absorbed power by TPA ($P_{abs}$) and the input power ($P_{in}$) as a function of $P_{abs}$ for different values of the Q-factor of the optical microresonator. In all calculations, most of the free carriers are assumed to have been swept away from the microresonator. Each panel also renders the corresponding results computed for several values of the preshift $\Delta\omega$ of the carrier frequency with respect to the resonant frequency of the system $\omega_0$. As can be observed in this figure, for each Q value, there is an optimal value of $\Delta\omega_0$ (approximately given by $\Delta\omega_0=\omega_0/Q$) which optimize the ratio $P_{abs}/P_{in}$ and for which no optical bistability effects are observed. A bistable system has an output that can take one of two distinct stable values at a particular input level. Note that in this case these bistability effects are produced by the shift of the refractive index due to the thermal effects produced by TPA. Optical bistability is detrimental to the performance of the photodetection scheme, and should thus be avoided.

The optimal $\Delta\omega_0$ actually corresponds to the maximum value of the frequency preshift $\Delta\omega$ that can be introduced in the carrier frequency before the microresonator start showing optical bistability properties. On the other hand, this $\Delta\omega_0$ is large enough to partially compensate the shift of the refractive index of the microresonator due to thermal effects produced by TPA, and, thus, it improves the ratio $P_{abs}/P_{in}$ with respect to the one obtained when $\Delta\omega=0$. The optimal input power found from the numerical analysis for each Q-value power scales roughly as $Q^{1/2}$.

The high values of the ratio $P_{abs}/P_{in}$ computed for the optimal $\Delta\omega$ corresponding to each one of the Q-values considered in FIG. 7 ($P_{abs}/P_{in}=0.07$, 0.02 and 0.008 for $Q=10^3$, $Q=10^4$, and $Q=10^5$, respectively) indicates the potential application of the novel photodetection scheme in the cw regime.

However, it should be noted that in the cw regime, the change of the refractive index in the microresonator is dominated by thermal effects, where the relevant time scale is given by the heat relaxation constant $\tau_{th}$. Heat relaxation constants of $\tau_{th} \sim 50$ ns has been experimentally obtained in structures similar to the ones considered here (see T. Tanabe et al. Opt. Lett. 30, 2575-2577 (2005), and S. F. Preble et al. Opt. Lett. 30, 2891-2893 (2005)). In order to reach the cw operation regime, the duration of each pulse should be $\sim\tau_{th}$, and therefore the time-interval between pulses should be $\sim100$ ns. Alternatively, the corresponding bit rate $\sim1/100$ ns=10 MHz, which makes the application of the cw regime described here only suitable for the photodetection of trains of optical pulses with bit rates up to $\sim10$ MHz.

The theoretical framework and the computational methods used to obtain the system performance parameters pertinent to the apparatus and method disclosed herein are fully described below.

Time-Dependent Coupled-Mode Theory

To accurately compute the temporal response of the class of systems disclosed here, a theoretical framework based on a combination of a coupled mode theory (CMT) and a first order perturbation theory is applied.

Insets of FIGS. 2b and 2c display the different magnitudes and parameters used in this description. In both insets, $\alpha_{cav}(t)$ stands for the electric field amplitude inside the microresonator, normalized so that $|\alpha_{cav}(t)|^2$ corresponds to the electromagnetic energy stored in the microresonator. $\tau_{IO}$ governs the coupling strength between the cavity and the microresonator, while $S_{IN}(t)$, $S_{REF}(t)$, and $S_{TRANS}(t)$ denote the amplitude of the input, reflected and transmitted pulses, respectively ($S_{TRANS}(t)$ only appears in FIG. 2c). These quantities have been normalized so that $|s_{IN}(t)|^2$, $|s_{REF}(t)|^2$, $|s_{TRANS}(t)|^2$ and are the input, reflected and transmitted powers, respectively. By using energy conservation arguments, it can be shown that the temporal evolution of $\alpha_{cav}(t)$ in the two different geometries displayed in FIGS. 2b and 2c can be described in a unified manner by means of the following nonlinear differential equation, $$\frac{da_{cav}}{dt} = i\omega_0\left(\Delta\bar{n}_{th} + \Delta\bar{n}_{fc} - \frac{\Delta\omega}{\omega_0}\right)a_{cav} - \quad (3)$$
$$[\gamma_{lin} + \gamma_{TPA}(|a_{cav}|^2) + \gamma_{FCA}(|a_{cav}|^4)]a_{cav} + \sqrt{2\gamma_{IO}}\,s_{IN}$$

where $\omega_0$ and $\Delta\omega$ are the resonant frequency of the system and the frequency preshift of the external source, respectively. $\gamma_{lin}$ corresponds to the sum of all the energy decay rate mechanisms of the microresonator in the linear regime: it includes the decay rate into the waveguide ($\gamma_{IO}$), the radiative losses ($\gamma_{rad}$) and the losses associated with linear absorption in the material ($\gamma_{abs}$). $\gamma_{TPA}$ and $\gamma_{FCA}$, which are functions of the energy stored in the microresonator ($|\alpha_{cav}|^2$), represent the two nonlinear absorption mechanisms of interest in this case, i.e., both TPA and FCA, respectively. The specific expressions for both $\gamma_{TPA}$ and $\gamma_{FCA}$ can be obtained by integrating the local absorption rates due to TPA and FCA over the geometry of the microresonator, given by $\gamma_{TPA}(\vec{r})=(1;2)\beta'(\vec{r})\in_0 n^2(\vec{r})|\vec{E}(\vec{r})|^2$ and $\gamma_{FCA}(\vec{r})=\sigma(\vec{r})N(\vec{r})$, respectively.

In these expressions, $\beta'(\vec{r})$ is the material dependent strength of the TPA process, $n^2(\vec{r})$ is the dielectric constant distribution of the microresonator, $\vec{E}(\vec{r})$ is the complex electric field profile of the resonant mode of the structure, $\in_0$ is the permittivity of free space, $\sigma'(\vec{r})$ is the free-carrier cross-section, and $N(\vec{r})$ represent the free carriers density inside the microresonator. Note that both $n^2(\vec{r})$ and $\vec{E}(\vec{r})$ correspond to unperturbed (i.e., in the linear regime) local refractive index and electric field, respectively.

From the first order perturbation theory, it can be deduced that the magnitudes $\Delta\bar{n}_{th}$ and $\Delta\bar{n}_{fc}$ appearing in the right-hand side of Eq. (1) correspond to the spatial averages of the refractive index changes in the microresonator due to thermal effects and the presence of free carrier (free carrier dispersion), respectively. Specifically, $\Delta\bar{n}_{th}$ and $\Delta\bar{n}_{fc}$ can be written as $\Delta\bar{n}_{th}(t)=-1/n_{Si}(dn_{Si}/dT)\Delta\bar{T}(t)$ and $\Delta\bar{n}_{fc}(t)=-1/n_{Si}(dn_{Si}/dN)\bar{N}(t)$, with $\Delta\bar{T}(t)$ and $\Delta\bar{N}(t)$ being the spatial average of the temperature increase in the microresonator and the free carriers density, respectively. The temporal evolution of these magnitudes is determined by the following differential equations (which, as can be observed, are in turn coupled to the one given in Eq. 1), $$\frac{d\Delta\overline{T}(t)}{dt} = -\frac{1}{\tau_{th}}\Delta\overline{T}(t) + \zeta_{th}P_{abs}(t) \quad (4)$$

$$\frac{d\overline{N}(t)}{dt} = -\frac{1}{\tau_{fc}}\overline{N}(t) + \zeta_N|a_{cav}(t)|^4 \quad (5)$$

where $\tau_{th}$ defines the heat relaxation constant corresponding to the specific geometry under study. $\xi_{th}$ depends both of the details of the specific geometry of the microresonator and the thermal conductivity of Si (for more information, see: P. Barclay et al., Opt. Express 13, 801-820 (2005)). In this work, the phenomenological values used for $\tau_{th}$ and $\xi_{th}$ correspond to the ones measured experimentally in similar structures (for more information, see: T. Tanabe et al., Opt. Lett. 30, 2575-2577 (2005), S. F. Preble et al., Opt. Lett. 30, 2891-2893 (2005), and P. Barclay et al., Opt. Express 13, 801-820 (2005)).

$\tau_{fc}$ denote the effective lifetime of the free carriers, which in our calculations has also been obtained from the available experimental results (for more information, see: T. Tanabe et al., Opt. Lett. 30, 2575-2577 (2005), S. F. Preble et al., Opt. Lett. 30, 2891-2893 (2005), and P. Barclay et al, Opt. Express 13, 801-820 (2005)), while $\xi_N$ depends exclusively on the geometry of the microresonator and it is proportional to the two-photon absorption coefficient of Si (for details on this parameter, see: P. Barclay et al., Opt. Express 13, 801-820 (2005)).

Finite-Difference-Time-Domain Calculations

A parallel implementation of finite-difference-time-domain (FDTD) method is used to compute both the electric field profiles shown in FIGS. 2b and 2c and their corresponding quality factors. This numerical method produces virtually exact results, apart from the discretization. The simulations were performed using a resolution of 40 pts per $\alpha$, which is found to give results with less that 0.1% of relative error. The results presented here correspond to two-dimensional (2D) simulations of the analyzed structures. In order to obtain an accurate estimation of the performance of the actual three-dimensional (3D) counterparts of the structures considered here, the electric field profile in the perpendicular direction to the plane shown in FIGS. 2b and 2c is assumed to be roughly the same as the mode profile computed for the 2D case. Specifically, it is assumed that the extension of the mode profile in the third dimension is about $\alpha/2$. This fact does not affect the generality of the results disclosed here, since it is possible to design true 3D structures with 2D electric field cross sections very similar to the ones shown here.

A number of embodiments of the apparatus and the method have been described. Nevertheless, it will be understood that various modifications may be made without departing from the spirit and scope of the invention. Therefore, other aspects, advantages, and modifications are within the scope of the following claims.

What is claimed is:

1. A system comprising:
an integrated silicon-based structure comprising an optical waveguide for receiving an input beam carrying an optical signal and a microcavity optically coupled to the waveguide and configured to receive optical energy from the input beam and absorb the optical energy by a nonlinear multi-photon absorption process,
the integrated silicon-based structure further comprising electrodes responsive to the nonlinear multi-photon absorption process in the microcavity for producing an electronic signal indicative of the optical signal.

2. The system of claim 1, wherein the microcavity comprises silicon and wherein the nonlinear multi-photon absorption process is in the silicon.

3. The system of claim 1, wherein the microcavity has a resonant frequency $\omega_0$, a quality factor Q, and a modal volume $V_{MODE}$, and wherein the input beam carrying the optical signal has a wavelength in air equal to $\lambda_{AIR}$, with 1.2 µm<$\lambda_{AIR}$<2.4 µm.

4. The system of claim 3, wherein Q>100 and $V_{MODE}$<1000 $\lambda_{AIR}^3$.

5. The system of claim 4, wherein Q>1000 and $V_{MODE}$<100 $\lambda_{AIR}^3$.

6. The system of claim 5, wherein $V_{MODE}$<10 $\lambda_{AIR}^3$.

7. The system of claim 4, wherein the input beam carrying the optical signal has a carrier frequency equal to $\omega$, and wherein $|\omega-\omega_0|/\omega_0$<10/Q.

8. The system of claim 7, wherein the input beam carrying the optical signal has a carrier frequency equal to $\omega$, and wherein $|\omega-\omega_0|/\omega_0$<5/Q.

9. The system of claim 8, wherein the input beam carrying the optical signal has a carrier frequency equal to $\omega$, and wherein $|\omega-\omega_0|/\omega_0$<1/Q.

10. The system of claim 1, wherein the microcavity has a resonant frequency $\omega_0$, a quality factor Q, and a modal volume $V_{MODE}$, and wherein the system further comprises a source for the input beam, and wherein the input beam carrying the optical signal has a wavelength in air equal to $\lambda_{AIR}$.

11. The system of claim 1, wherein the microcavity is configured to achieve a conversion efficiency for the multi-photon absorption of the optical energy in the input beam of greater than 15% for an input beam power smaller than 0.2 mW.

12. The system of claim 1, wherein the microcavity is a photonic crystal structure.

13. The system of claim 1, wherein the waveguide is a photonic crystal structure.

14. The system of claim 1, wherein the integrated silicon-based structure is implemented in a Complementary metal-oxide-semiconductor (CMOS) platform.

15. The system of claim 1, wherein the input beam carrying the optical signal has a carrier frequency equal to $\omega$, wherein N photons, with N>1, are absorbed simultaneously by a material in the microcavity during the multi-photon absorption process, and wherein the multi-photon absorption material has an indirect electronic bandgap $E_g$ larger than the energy corresponding to a single photon of frequency $\omega$ and smaller than the energy of the N photons absorbed simultaneously by the material.

16. The system of claim 1, wherein the integrated silicon-based structure further comprises an output optical waveguide optically coupled to the microcavity and configured to output optical energy from the microcavity that is not absorbed by the multi-photon absorption process.

17. The system of claim 1, wherein the multi-photon absorption process is a two-photon absorption (TPA).

18. The system of claim 1, wherein the integrated silicon-based structure comprises multiple microcavities each optically coupled to the waveguide and configured to receive optical energy from the input beam and absorb the optical energy by a nonlinear multi-photon absorption process.

19. The system of claim 1, further comprising an external voltage source configured to apply an external voltage across the electrodes to extract a photocurrent from the integrated silicon-based structure in response to the non-linear multi-photon absorption process and produce the electronic signal indicative of the optical signal.

20. The system of claim 19, wherein the external voltage is configured to enable an electrical readout of the optical signal.

21. The system of claim 19, wherein the external voltage applied across the electrodes causes the integrated silicon-based structure to form a reversed biased p-i-n junction.

22. The system of claim 21, wherein the reversed biased p-i-n junction sweeps out free carriers generated inside the microcavity.

23. Apparatus comprising:
an integrated silicon-based structure comprising an optical waveguide for receiving an input beam carrying an optical signal and a microcavity optically coupled to the waveguide and configured to receive optical energy from the input beam and absorb the optical energy by a nonlinear multi-photon absorption process,
the integrated silicon-based structure further comprising electrodes responsive to the nonlinear multi-photon absorption process in the microcavity for producing an electronic signal indicative of the optical signal,
wherein the microcavity comprises silicon and wherein the nonlinear multi-photon absorption process is in the silicon, and
wherein the micro cavity has a resonant frequency $\omega_0$, a quality factor Q, and a modal volume $V_{MODE}$, and wherein the input beam carrying the optical signal has a wavelength in air equal to $\lambda_{AIR}$, with 1.2 µm<$\lambda_{AIR}$<2.4 µm, and wherein Q>100 and $V_{MODE}$<1000 $\lambda_{AIR}^3$.

24. The apparatus of claim 23, further comprising an external voltage source configured to apply an external voltage across the electrodes to extract a photocurrent from the integrated silicon-based structure in response to the non-linear multi-photon absorption process and produce the electronic signal indicative of the optical signal.

25. The apparatus of claim 24, wherein the external voltage is configured to enable an electrical readout of the optical signal.

26. The apparatus of claim 24, wherein the external voltage applied across the electrodes causes the integrated silicon-based structure to form a reversed biased p-i-n junction.

27. The apparatus of claim 26, wherein the reversed biased p-i-n junction sweeps out free carriers generated inside the microcavity.

28. A system comprising:
an integrated silicon-based structure comprising a micro cavity configured to receive optical energy from an input beam carrying an optical signal and absorb the optical energy by a nonlinear multi-photon absorption process,
the integrated silicon-based structure further comprising electrodes responsive to the nonlinear multi-photon absorption process in the microcavity for producing an electronic signal indicative of the optical signal,
wherein the microcavity comprises silicon and wherein the nonlinear multi-photon absorption process is in the silicon.

29. The system of claim 28, wherein the integrated silicon-based structure further comprises an optical waveguide for receiving the input beam carrying an optical signal, and wherein the microcavity is optically coupled to the waveguide to receive the optical energy from the input beam.

30. The system of claim 28, further comprising an external voltage source configured to apply an external voltage across the electrodes to extract a photocurrent from the integrated silicon-based structure in response to the non-linear multi-photon absorption process and produce the electronic signal indicative of the optical signal.

31. The system of claim 30, wherein the external voltage is configured to enable an electrical readout of the optical signal.

32. The system of claim 30, wherein the external voltage applied across the electrodes causes the integrated silicon-base structure to form a reversed biased p-i-n junction.

33. The system of claim 32, wherein the reversed biased p-i-n junction sweeps out free carriers generated inside the microcavity.

* * * * *

UNITED STATES PATENT AND TRADEMARK OFFICE
CERTIFICATE OF CORRECTION

PATENT NO. : 8,515,216 B2
APPLICATION NO. : 12/611287
DATED : August 20, 2013
INVENTOR(S) : Jorge Bravo Abad, Erich P. Ippen and Marin Soljacic Page 1 of 1

It is certified that error appears in the above-identified patent and that said Letters Patent is hereby corrected as shown below:

Title Page 2
Column 1 (Other Publications), line 11, Dehlinger et al. reference, delete "Speec" and insert -- Speed --

In the Claims

Column 17
Line 31, in Claim 23, delete "micro cavity" and insert -- microcavity --

Column 18
Lines 11-12 (Approx.), in Claim 28, delete "micro cavity" and insert -- microcavity --

Signed and Sealed this
Twelfth Day of November, 2013

Teresa Stanek Rea
*Deputy Director of the United States Patent and Trademark Office*